(12) United States Patent
Ito et al.

(10) Patent No.: US 7,755,932 B2
(45) Date of Patent: Jul. 13, 2010

(54) SPIN TORQUE MAGNETIC MEMORY AND OFFSET MAGNETIC FIELD CORRECTING METHOD THEREOF

(75) Inventors: Kenchi Ito, Kunitachi (JP); Jun Hayakawa, Hino (JP); Katsuya Miura, Sendai (JP)

(73) Assignee: Hitachi, Ltd., Tokyo (JP)

( * ) Notice: Subject to any disclaimer, the term of this patent is extended or adjusted under 35 U.S.C. 154(b) by 17 days.

(21) Appl. No.: 12/339,167

(22) Filed: Dec. 19, 2008

(65) Prior Publication Data

US 2009/0161414 A1 Jun. 25, 2009

(30) Foreign Application Priority Data

Dec. 19, 2007 (JP) ............................. 2007-326706

(51) Int. Cl.
*G11C 11/00* (2006.01)
(52) U.S. Cl. ........................ 365/158; 365/173; 365/148; 365/171; 365/225.5; 977/935
(58) Field of Classification Search ................... 365/48, 365/66, 78, 80–93, 100, 130, 131, 148, 158, 365/171, 173, 225.5, 243.5; 257/421, E21.665; 438/3; 977/933–935
See application file for complete search history.

(56) References Cited

U.S. PATENT DOCUMENTS

| 5,734,605 A | 3/1998 | Zhu et al. | |
| 2002/0003720 A1* | 1/2002 | Bohm et al. | 365/158 |
| 2002/0057594 A1* | 5/2002 | Hirai | 365/171 |
| 2007/0064472 A1* | 3/2007 | Kawagoe et al. | 365/158 |

OTHER PUBLICATIONS

Slonezewski et al., "Current-driven Excitation of Magnetic Multilayers", Journal of Magnetism and Magnetic Materials, 159, L1-6 (1996).
Katine et al., "Current-driven Magnetization Reversal and Spin-Wave Excitation in Co/Cu/Co Pillars", "Physical Review Letters, vol. 84, No. 14, pp. 3149-3152 (2000)".
Huai et al., "Observation of spin-transfer switching in deep submicron-sized and low-resistance magnetic tunnel junctions", Applied Physics Letters, vol. 84, pp. 3118-3120 (2004).

(Continued)

*Primary Examiner*—J. H. Hur
*Assistant Examiner*—Harry W Byrne
(74) *Attorney, Agent, or Firm*—Antonelli, Terry, Stout & Kraus, LLP (57) ABSTRACT

An object of the present invention corrects fluctuation of a writing current between cells in a magnetic random access memory using spin torque magnetization reversal. The present invention includes a magneto-resistive effect element that is disposed between a bit line and a word line, a first variable resistance element that is connected to one end of the bit line, a second variable resistance element that is connected to the other end of the bit line, a first voltage applying unit that applies voltage to the first variable resistance element, and a second voltage applying unit that applies voltage to the second variable resistance element, when a writing operation is performed, an offset magnetic field is applied to a free layer of the magneto-resistive effect element by flowing a variable current between the first voltage applying unit and the second voltage applying unit based on a predetermined resistance value.

15 Claims, 9 Drawing Sheets

OTHER PUBLICATIONS

Huai et al., "Spin transfer switching current reduction in magnetic tunnel junction based dual spin filter structures", Applied Physics Letters, vol. 87, pp. 232502 (2005).

Albert et al., "Spin-polarized current switching of Co thin film nanomagnet", Applied Physics Letters, vol. 77, 23, pp. 3809-3811.

* cited by examiner

FIG. 1A

CURRENT AT THE TIME OF SWITCHING AP → P

FIG. 1B

CURRENT AT THE TIME OF SWITCHING P → AP

CURRENT AT THE TIME OF SWITCHING AP → P

FIG. 8B

CURRENT AT THE TIME OF SWITCHING P → AP

FIG. 9

SPIN TORQUE MAGNETIC MEMORY AND OFFSET MAGNETIC FIELD CORRECTING METHOD THEREOF

CLAIM OF PRIORITY

The present application claims priority from Japanese Patent Application JP 2007-326706 filed on Dec. 19, 2007, the content of which is hereby incorporated by reference into this application.

FIELD OF THE INVENTION

The present invention relates to a magnetic random access memory using spin torque magnetization reversal.

BACKGROUND OF THE INVENTION

In recent years, a magnetic random access memory (MRAM) has become a topic of interest. In the MRAM of the related art, for example, a method as described in U.S. Pat. No. 5,734,605 performs recording by reversing magnetization at one side of a tunnel magneto-resistive effect (TMR) element having a multi-layer structure of magnetic film/non-magnetic insulating film/magnetic film by using a combined magnetic field that is generated due to current flowing in two metal lines disposed in an orthogonal direction to each other at an upper and lower of the TMR element.

However, in the MRAM, if a size of the TMR element becomes small so as to make its capacity large, a magnitude of a magnetic field required for reversing magnetization should be large. For this reason, there is a need to flow a large amount of current in the metal lines of the MRAM. As a result, there is a problem in that power consumption increases and the metal lines become damaged.

As a method of performing magnetization reversal without using a magnetic field, there is, for example, a "Journal of Magnetism and Magnetic Materials, 159, L1-6 (1996)" that can achieve the magnetization reversal by flowing a predetermined or more current in a giant magneto-resistive effect (GMR) film or a tunnel magneto-resistive effect (TMR) film that are used in a magnetic reproducing head.

Thereafter, "Physical Review Letters, Vol. 84, No. 14, pp. 3149-3152 (2000)" and "Applied Physics Letters, Vol. 77, 23, pp. 3809-3811" disclose an experimental example of a recording method that reverses magnetization of a Co layer by forming a pillar having a diameter of 130 nm including a multi-layer film (GMR film) of Co/Cu/Co between two electrodes of Cu, flowing current in the pillar, and using the spin torque provided to the magnetization of the Co layer by spinning the flowing current.

In recent years, "Applied Physics Letters, Vol. 84, pp. 3118-3120 (2004)" discloses an actual proof the spin torque magnetization reversal is possible by using a nano pillar that uses the TMR film. In particular, reversing the spin torque magnetization using the TMR film can obtain an output that is equal to or more than the MRAM of the related art, such that this has become an interested topic.

SUMMARY OF THE INVENTION

However, the TMR-type MRAM using the spin torque magnetization reversal of the related art has the following problems. Generally, the TMR film uses a thick film of about 1 nm as an insulating film.

In the case of the TMR, when magnetization of a fixed layer where magnetization is fixed is anti-parallel with magnetization of a free layer where magnetization can be changed according to a current direction, both magnetizations are stabilized to facilitate magneto-static combination thereof.

For this reason, for example, as described in "Applied Physics Letters, Vol. 87, pp. 232502 (2005)", in the case of measuring a change in a magnetization direction with respect to a magnetic field, both the magnetization reversals from anti-parallel to parallel and from parallel to anti-parallel state generate a magnetic field in a negative area. At this time, the magnetization reversal can be finally realized by providing the magnetic field corresponding to a central magnetic field value (hereinafter, referred to a magnetic field offset) of a hysteresis curve of magnetic field-magnetization from the outside without generating the spin torque magnetization reversal in a state where a magnitude of an external magnetic field is zero.

Further, since the magnetic field offset largely depends on the manufacturing conditions of the TMR pillar, fluctuation can be easily caused even between the same type of TMR pillars manufactured within the same wafer. As a result, this has a large effect on the yield of the MRAM.

An object of the present invention is to correct fluctuation of a writing current between cells in a magnetic random access memory using spin torque magnetization reversal.

In order to solve the above problems, there is provided a spin torque magnetic memory according to the present invention comprising: a bit line and a word line; a magneto-resistive effect element that is disposed between the bit line and the word line; a first variable resistance element that is connected to one end of the bit line; a second variable resistance element that is connected to the other end of the bit line; a third variable resistance element that is disposed between the magneto-resistive effect element and the word line; a first voltage applying unit that applies voltage to the first variable resistance element; a second voltage applying unit that applies voltage to the second variable resistance element; and a third voltage applying unit that applies voltage to the third variable resistance element, wherein the magneto-resistive effect element includes a first ferromagnetic layer whose magnetization direction is variable, a second ferromagnetic layer whose magnetization direction is fixed, and an intermediate layer that is disposed between the first ferromagnetic layer and the second ferromagnetic layer, wherein when a writing operation is performed, based on a predetermined resistance value, the magnetization of the first ferromagnetic layer is reversed by a spin torque that is generated by flowing current between the first voltage applying unit and the second voltage applying unit and between the first bit line and the third voltage applying unit.

Preferably, a current value flowing between the first voltage applying unit and the second voltage applying unit is variable.

Preferably, a current-induced magnetic field direction generated by flowing current between the first voltage applying unit and the second voltage applying unit is approximately parallel with a magnetization direction where the second ferromagnetic layer is fixed.

Preferably, a current-induced magnetic field direction generated by flowing current between the first voltage applying unit and the second voltage applying unit is approximately parallel with a magnetization easy axis of the first ferromagnetic layer.

With the present invention, the magnetic random access memory using the spin torque magnetization reversal can correct the threshold value of the writing current and increase the yield of the MRAM, thus providing a memory array. In other words, the magnetic random access memory using the spin torque magnetization reversal, which increases the yield of the MRAM can be realized.

DETAILED DESCRIPTION OF THE PREFERRED EMBODIMENTS

Hereinafter, a spin torque magnetic memory of the present invention will be described in more detail.

A spin torque magnetic memory of the present invention basically includes a tunnel magneto-resistive effect element having a switching element that controls conduction by a gate electrode, a multi-layer film that includes a first magnetic layer that is electrically connected to the switching element, a non-magnetic insulating layer, and a second magnetic layer. Further, the spin torque magnetic memory includes: a unit that makes the magnetic layer of the multi-layer film into a film that performs recording by fixing magnetization of the magnetic layer at one side of the multi-layer film and changing a magnetization direction of the magnetic layer at the other side thereof by flowing current vertically with respect to a film surface of the multi-layer film, connects the tunnel magneto-resistive effect element to a bit line at one end of a side opposite to the switching element, makes a magnetization easy axis of the magnetic layer capable of changing the magnetization direction vertical with respect to the bit line, disposes resistance elements capable of changing resistance at both ends of the bit line, and biases both ends of the bit line via the resistance elements using a predetermined voltage V1 and voltage V2; a unit that controls the voltage so that voltage V2 is always larger than voltage V1; and a unit that applies voltage V3 to one end and the other end opposite thereto of the switching element that controls conduction by the gate electrode, the one end being connected to the magneto-resistive effect element.

Further, the magnetization direction of the magnetic layer where the magnetization is fixed is approximately equal to a current-induced magnetic field direction generated by having current flowing in the bit line rotate the bit line. Moreover, in the multi-layer film configuring the tunnel magneto-resistive effect element, a layer that reverses the magnetization direction by flowing current onto film surfaces of the multi-layer films is configured as ferromagnetic layers that are combined with each other in an anti-parallel magnetization state, putting an intermediated layer therebetween.

Further, the magnetic memory is configured of a sub-array that is smaller than the whole capacity and includes a unit that controls values of voltages V1, V2, and V3 and a resistance value of the variable resistance element for each sub-array.

Hereinafter, exemplary embodiments of the present invention will be described in detail with reference to the accompanying drawings.

First Embodiment

Figure 3:
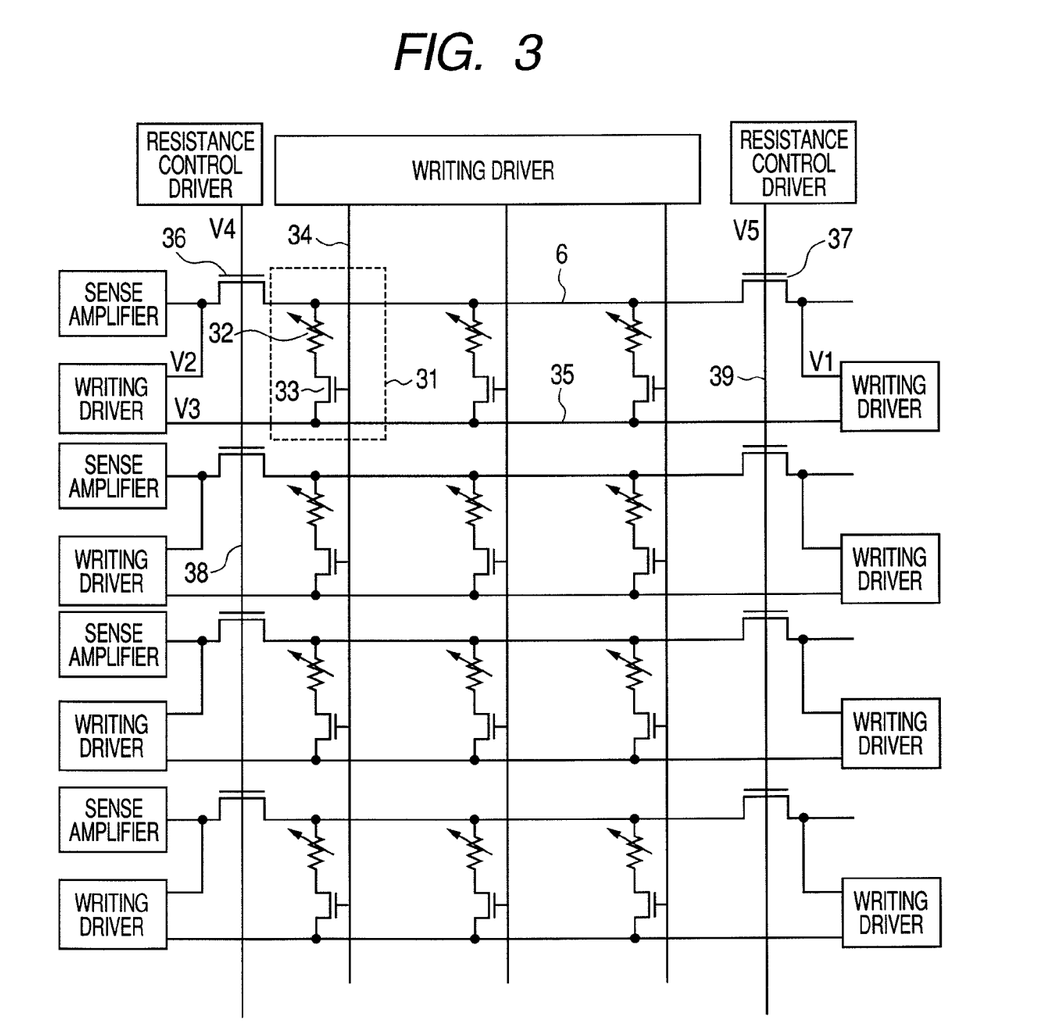
FIG. 3 is a configuration diagram of one example of a magnetic memory array of the present invention.

FIG. 3 shows a configuration example of a cell array. An area 31 surrounded by a dotted line is a unit cell. The cell array includes a magneto-resistive effect element 32, a CMOS transistor 33, a word line 34 that supplies voltage to a gate electrode of the CMOS transistor 33, a source line 35 that supplies voltage to the CMOS transistor 33, and variable resistance elements 36 and 37 that control current flowing in a bit line 6. Herein, as the variable resistance elements 36 and 37, for example, the CMOS transistor can be used. Further, the cell array includes special word lines 38 and 39 that supply voltage to the gate of the CMOS transistors 36 and 37 to control the resistance value of the CMOS transistors 36 and 37. One end of the bit line 6 is connected to a sense amplifier that detects a resistance change of the magneto-resistive effect element and both ends of the bit line 6 and the source line 35 are connected to a writing driver. The word line 34 is connected a separate writing driver and the word lines 36 and 37 are connected to a driver for controlling resistance.

Figure 1A:
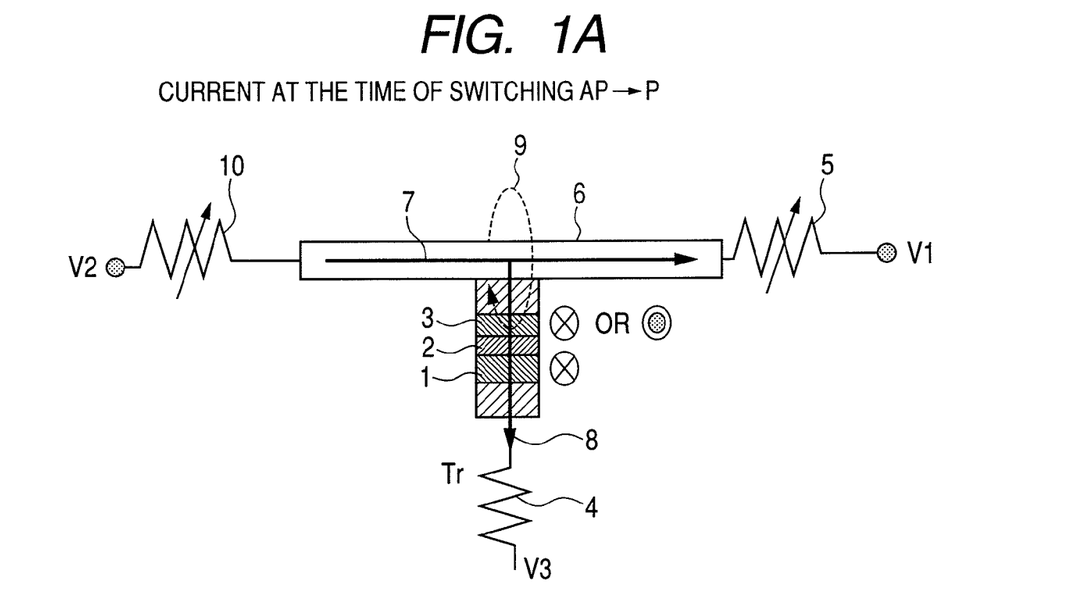
FIGS. 1A and 1B are configuration diagrams of element units of a spin torque magnetic memory according to a first embodiment of the present invention.
Figure 1B:
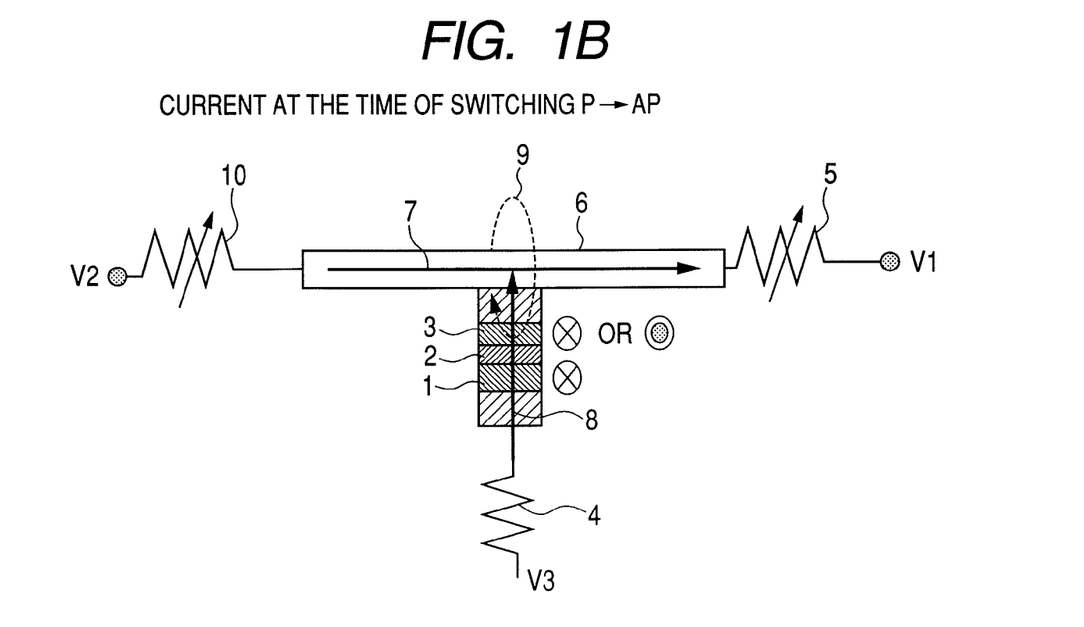

FIGS. 1A and 1B are configuration diagrams of element units of a spin torque magnetic memory. Herein, FIG. 1A shows a case of performing a switching from an anti-parallel (AP) state to a parallel (P) state and FIG. 1B shows a case of switching from a parallel (P) state to an anti-parallel (AP) state.

In the element unit of the spin torque magnetic memory, a stacked film (corresponding to a magneto-resistive effect element 32 shown in FIG. 3) is electrically connected to a bit line (BL) 6. The stacked film includes a non-magnetic intermediate layer 2 between a first ferromagnetic layer (fixed layer) 1 and a second ferromagnetic layer (free layer) 3.

In the element unit of the spin torque magnetic memory, a switching element 4 (corresponding to a CMOS transistor 33 shown in FIG. 3) is disposed at a side opposite to the bit line side of the stacked film and electrically connected to the stacked film. Further, a variable resistance element 5 (corresponding to a variable resistance element 36 shown in FIG. 3) and a variable resistance element 10 (corresponding to a variable resistance element 37 shown in FIG. 3) are disposed at both ends of the bit line 6.

Further, a layer (for example, a non-magnetic metal layer and the like) using materials in which current flows may be disposed between the stacked film and the bit line (BL) 6. Also, a layer (for example, a non-magnetic metal layer and the like) using materials in which current flows may be disposed between the stacked film and the switching element 4.

The magnetization direction of the first ferromagnetic layer (fixed layer) 1 is fixed. As a method for fixing the magnetization direction of the fixed layer 1, for example, an exchange coupling field from an anti-ferromagnetic layer is used. The non-magnetic intermediate layer 2 can use an insulating film when the non-magnetic intermediate layer is the tunnel magneto-resistive effect element. Since the magnetization direction of the free layer 3 is not fixed, the free layer 3 has the magnetization direction that is anti-parallel with the magnetization direction of the fixed layer 1 in an anti-parallel state and the magnetization direction that is parallel with the magnetization direction of the fixed layer 1 in a parallel state.

A direction where the magnetization of the free layer 3 proceeds in a stabilized state at room temperature is referred to as a magnetization easy axis. For example, in the case of FIG. 1, the magnetization easy axis proceeds to a direction that is approximately vertical to the bit line. In actual room temperature, the magnetization direction has predetermined distribution due to a thermal motion and a magnitude Θ of the distribution can be appreciated from an equation (1). Herein, k is a Baltzmann coefficient, T means an absolute temperature, $\mu_0$ is the vacuum transmittance, Ms is a residual magnetization of the free layer, Hk means an anisotropy magnetic field of the free layer, and V is a volume of the free layer. Normally, in room temperature, the angle Θ is 6° to 8°. Actually, even if the magnetization easy axis is inclined corresponding to the size of the angle, there is no problem.

$$\Theta = [Kt/(\mu_0 MsHkV)]^{1/2} \quad (1)$$

The stacked film, which includes the fixed layer 1, the non-magnetic intermediate layer 2, and the free layer 3, may be generally processed in an oval shape or a hexagonal shape whose one side is long so as to exhibit the magnetic anisotropy. The switching element 4 is a unit that flows current 8 in the stacked film. As the switching elements, for example, a CMOS transistor is used. The variable resistance elements 5 and 10 have a function of controlling the magnitude of current 7 that flows in the bit line 6. A magnetic field 9 is generated around the bit line 6 due to the current 7.

Figure 7A:
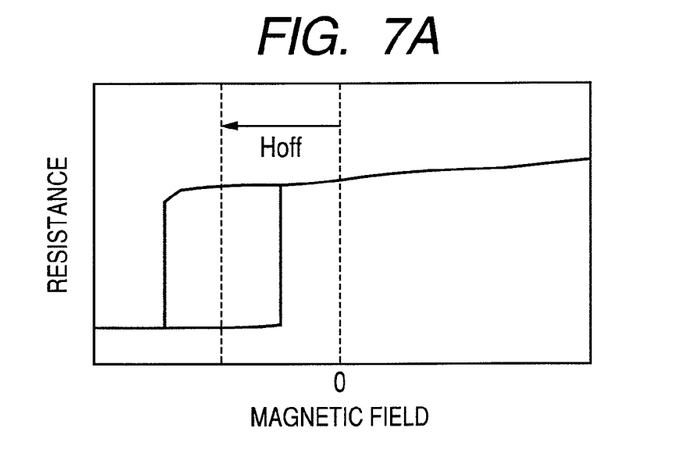
FIGS. 7A to 7C are pattern diagrams of magnetic field-resistance hysteresis of the magneto-resistive effect element of the present invention.
Figure 7B:
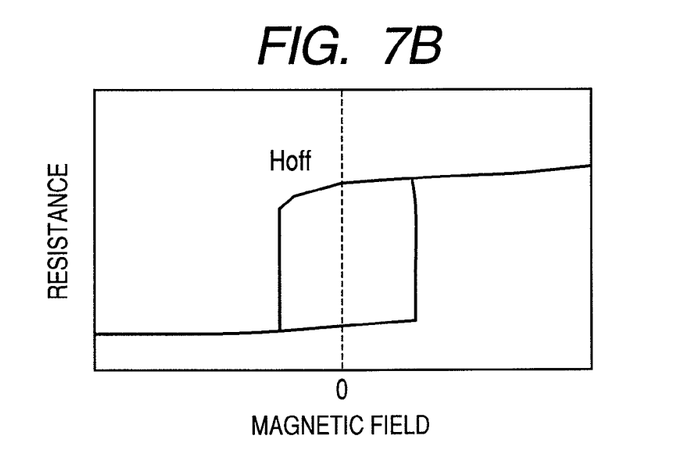
Figure 7C:
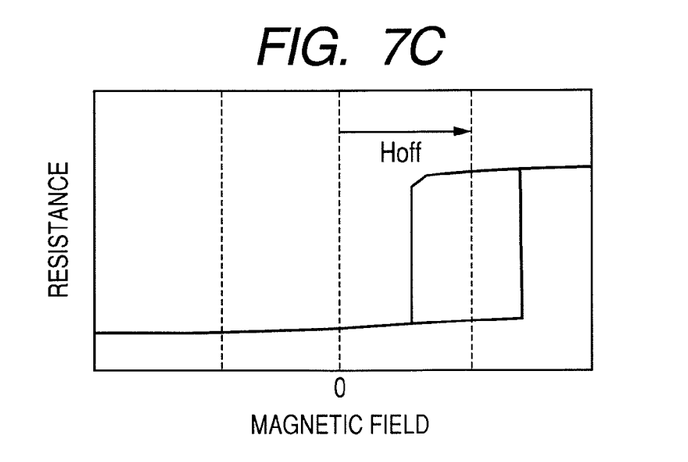

Next, the operation of the memory of the first embodiment will be described. FIGS. 7A to 7C are pattern diagrams showing a representative example of the magnetic field-resistance hysteresis of the magneto-resistive effect element used for the memory. FIG. 7A shows a case where a center of the hysteresis leans to a negative side of the magnetic field. FIG. 7B shows a case where a center of the hysteresis is approximately symmetrical with a magnetic field of zero. FIG. 7C shows a case where a center of the hysteresis leans to a positive side of the magnetic field. Herein, the fluctuation of the central magnetic field of the hysteresis shown in FIGS. 7A and 7C is referred to as an offset magnetic field (Hoff).

Figure 2:
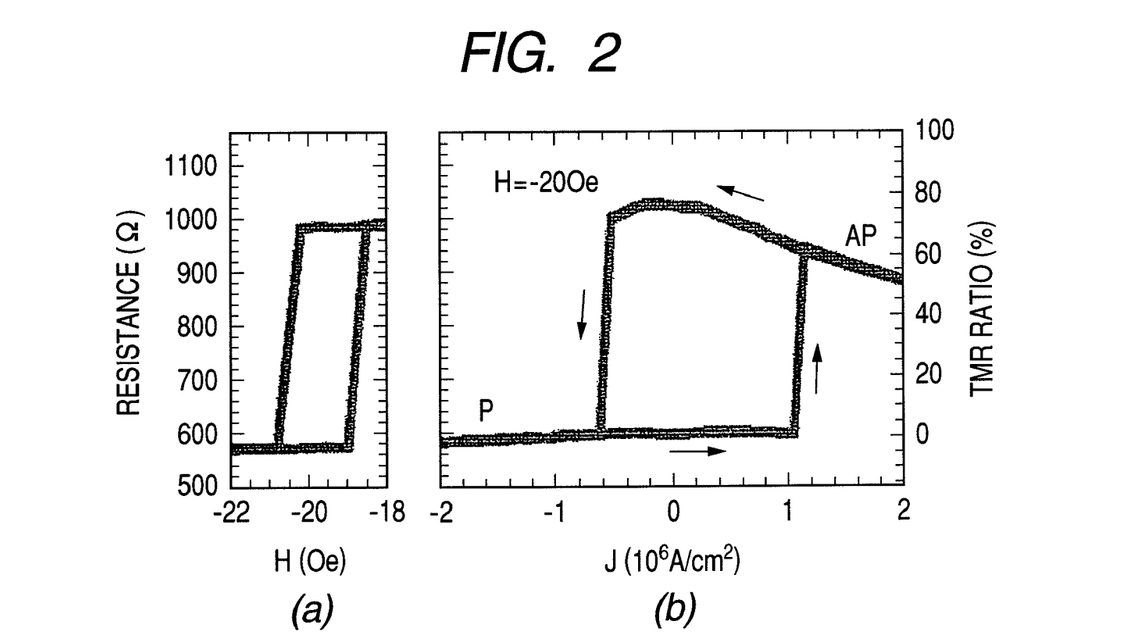
FIG. 2 is diagram showing hysteresis characteristics when a stacking body is a tunnel magneto-resistive effect element of the first embodiment.

FIG. 2 shows one example of a value measuring hysteresis in the case where the tunnel magneto-resistive effect element is for example applied as the stacking body shown in FIG. 1. FIG. 2 (a) shows magnetic field-resistance characteristic and FIG. 2 (b) shows current density-resistance characteristic. In the spin torque magnetic memory element, a side having the magnetization anti-parallel (AP) state where the resistance as shown in FIG. 2 is high is considered to be stable. For this reason, a state where the magnetization direction used for the operation of the memory that has dual stability cannot be realized unless the magnetic field of about −20 Oe is applied. In other words, the offset magnetic field is −20 Oe. For this reason, in order for the tunnel magneto-resistive effect element to perform the spin torque magnetization reversal, as shown in FIG. 2 (b), it is essential to apply the magnetic field of −20 Oe. A phenomenon, which is essential to apply the magnetic field of −20 Oe, is generally shown in the tunnel magneto-resistive effect element having a thin insulating layer 2.

The present invention proposes a method that cancels the Hoff by using the magnetic field generated by current flowing in the bit line. First, the case where the magnetization from the anti-parallel (AP) magnetic field state to the parallel (P) state is reversed, as shown in FIG. 1A, each of voltage V2 and voltage V1 is applied to the bit line connected to a cell, which performs the writing, via the variable resistance element 10 from the corresponding writing driver and via the variable resistance element 5 from the writing driver at the other end, respectively. At the same time, the writing driver of the word line is turned-on to boost the word line and the switching element 4 is turned on to apply voltage V3 to one end at a side opposite to the stacked film (for example, a tunnel magneto-resistive effect element) of the switching element 4. In this case, the value of voltage is controlled to make V1<V2 and V2>V3 so that the current 7 flows (an arrow direction of the current 7) from the left to the right of the bit line 6 and the current flows from the free layer 3 to the fixed layer 1 of the tunnel magneto-resistive effect element.

Next, the case where the magnetization from the parallel (P) state to the anti-parallel (AP) state is reversed, as shown in FIG. 1B, the value of the voltage is V1<V2 and the value of voltage V3 applied to one end at a side opposite to the stacked film (for example, a tunnel magneto-resistive effect element) of the switching element 4 is V2>V3>V1 so that the current 7 flows (for example, an arrow direction of the current 7) from the left to the right of the bit line 6.

Further, the values of the applied voltage (all the voltages V1, V2, and V3) are changed by the resistance of the stacked film, the resistance of the variable resistance elements 5 and 10, the ON resistance of the switching element 4, the threshold current value of the spin torque magnetization reversal, and the value of the Hoff.

One example of a set voltage value for the tunnel magneto-resistive effect element including the magnetic field-resistance hysteresis shown in FIG. 2 is shown. When the shape of the element is an oval shape of 50×100 nm, the threshold current I⁻ equals to −90 µA and I⁺ equals to 150 µA. Further, in order to correct the Hoff of −20 Oe, when the free layer 3 is disposed at a place where the free layer is separate from the bit line 6 by at least 30 nm, such that the current 7 that flows in the bit line 6 is about 0.3 mA. Further, the resistance in the P state of the tunnel magneto-resistive effect element is 0.6 kΩ and the resistance of the AP state is 1.0 kΩ.

As a result, if the ON resistance of the switching element 4 is 1.1 kΩ and the voltage V1 is ground (V1=0), when current of −0.2 mA flows in the tunnel magneto-resistive effect element to switch the AP state to the P state, V2−V3=0.44+0.5 R2 and V2=0.3 R1+0.5 R2 (R1 is the resistance of the variable resistance element 5 and R2 is the resistance of the variable resistance element 10). If V3=0V, that is, one end of the switching element 4 is ground, it may be permitted that R2=1 kΩ, R1=3.1 kΩ, and V2=1.43 V. In contrast, when current of +0.2 mA flows to switch the P state to the AP state, V2=0.3 R1+0.5 R2 and V3=0.44+0.3 R1. Likewise the case where the switching from the AP state to the P state is performed, when R2=1 kΩ and R1=3.1 kΩ, it may be permitted that V2=1.43V and V3=1.37 V.

As shown in FIG. 1, the foregoing description is an example of a case where the sequence stacking the films that configures the magneto-resistive element are stacked in a sequence of the fixed layer, the intermediate layer, and the free layer from the side of the switching element.

Second Embodiment

Figure 8A:
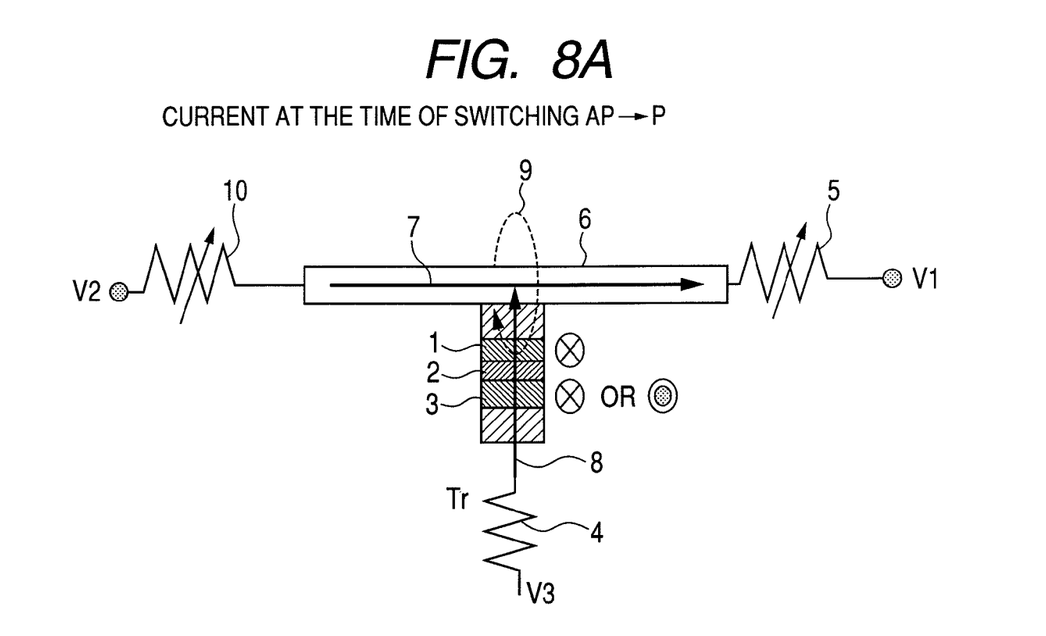
FIGS. 8A and 8B are another configuration diagrams of an element unit of a spin torque magnetic memory according to a second embodiment.
Figure 8B:
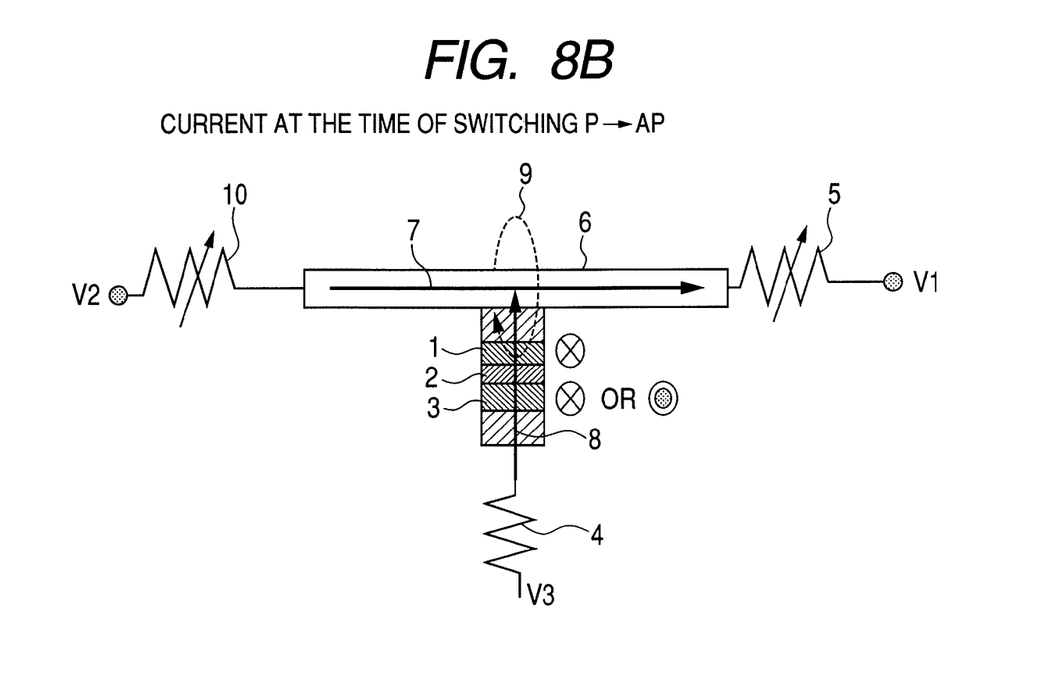

Next, FIGS. 8A and 8B show a case where the sequence stacking the films that configures the magneto-resistive element are stacked in a sequence of the free layer 3, the intermediate layer 2, and the fixed layer 1 from the side of the switching element. Herein, FIG. 8A shows a case where the switching from the anti-parallel (AP) state to the parallel (P)

state is performed and FIG. 8B shows a case where the switching from the parallel (P) state to the anti-parallel (AP) state is performed. Comparing with the embodiment of FIG. 1, it should be noted that the current 8 flows in a direction opposite to the current direction shown in FIG. 1. In this case, the operation of the memory is approximately the same as the embodiment of FIG. 1. On the other hand, since the current flows in a direction opposite to the current direction shown in FIG. 1, the relationship in the magnitude of the voltage is different from the embodiment of FIG. 1. The relationship in the magnitude of the voltage for the memory element of FIGS. 8A and 8B will be described below.

First, the case where the magnetization is reversed from the anti-parallel (AP) magnetic field to the parallel (P) state, as shown in FIG. 8A, the voltage V2 and the voltage V1 each are applied to the bit line connected to a cell, which performs the writing, via the variable resistance element 10 from the corresponding writing driver and via the variable resistance element 5 from the writing driver at the other end, respectively. At the same time, the writing driver of the word line is turned-on to boost the word line and the switching element 4 is turned on to apply the voltage V3 to one end at a side opposite to the stacked film (for example, a tunnel magneto-resistive effect element) of the switching element 4. In this case, the value of voltage is controlled to make V1<V2 and V2>V3>V1 so that the current 7 flows (an arrow direction of the current 7) from the left to the right of the bit line 6 and the current flows from the free layer 3 to the fixed layer 1 of the tunnel magneto-resistive effect element.

Next, the case where the magnetization from the parallel (P) state to the anti-parallel (AP) state is reversed, as shown in FIG. 8B, the value of voltage is V1<V2 and the value of the voltage V3 applied to one end at a side opposite to the stacked film (for example, a tunnel magneto-resistive effect element) of the switching element 4 is V2>V3 so that the current 7 flows (an arrow direction of the current 7) from the left to the right of the bit line 6.

Even in either embodiment 1 or embodiment 2 as described above, the values of the voltage V1, V2, and V3 and the values of the resistance R1 and R2 should be set according to the value of the resistance of the AP state/P state of the stacked film, the value of the ON resistance of the CMOS for switching, and the value of the Hoff. These values fluctuate by several % for each cell. For this reason, how to set the value of the voltage and resistance in the whole memory is important.

Third Embodiment

Hereinafter, a method that sets the values of the voltages V1, V2, and V3 and the value of the resistance R1 and R2 in the cell array of FIG. 3 will be described.

These values are set for each sub-array formed by separating the whole memory array. Generally, since the resistance values of the AP state and the P state of the magneto-resistive effect element, the value of the ON resistance of the CMOS for switching, and the value of the Hoff is changed bit by bit in a place within a wafer used at the time of manufacturing the memory, it is sufficient to set these values for each sub-array occupying a small area.

Figure 9:
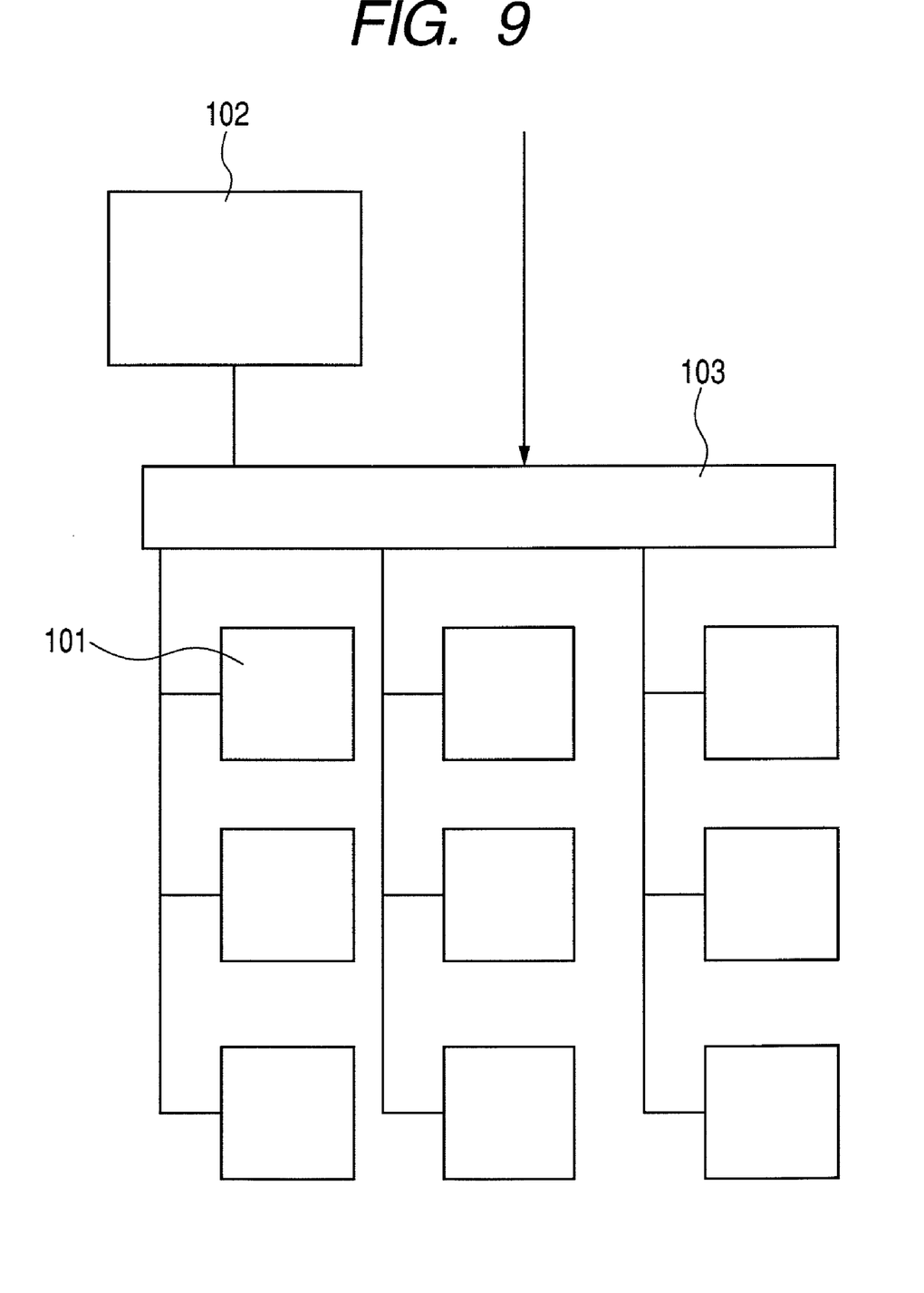
FIG. 9 is a configuration diagram of the whole memory according to a third embodiment of the present invention.

FIG. 9 is a concept diagram showing one example of a configuration of the whole memory of the present invention. Reference numeral 101 is a sub-array configuring the memory and generally includes cells having about 1 to 64 kb. Reference numeral 102 is a storage region that stores information and exists outside the sub-array. Reference numeral 103 is an I/O controller that controls the input of information in the sub-array and the writing of information in the storage region based on the instructions from the external controller.

The detailed sequence according to the third embodiment depends on the following description. The controller 103 selects the cell that performs the writing and the sub-array belonging to the cell by the address information designated from the external controller. The following operation is performed through the controller 103. First, for the designated cell, V1 is ground, that is, V1 is set to 0. This has an effect of simplifying the configuration of the writing driver. In detail, the cell drops to a ground that grounds only one end of the cell writing driver, an extra offset circuit and the like is not needed, such that the configuration of the circuit can be simplified.

In the case of performing the writing from the AP state to the P state, a source line is first ground (V3=0). Next, a resistance controlling driver is operated to boost bit lines 38 and 39 to voltage V4 and voltage V5, respectively. The writing from the AP state to the P state is performed by supplying the voltage V2. V2, V4, and V5 are set previously set values.

After the writing ends, success probability of the writing is obtained by reading the resistance of each cell. This is repeated while changing V5 to determine the value of V5 that allows the maximum possibility in writing and record the value of V5 in the recording region 102 (recording unit) included outside the memory. Thereby, the optimal value of R2 is set. When the writing possibility is not sufficient, the value of V5 that allows the maximum possibility in writing is fixed, R5 is searched in order to allow the possibility of success in re-writing while changing V4 maximum, and the searched value is recorded in the recording region. Thereby, the optimal value of R1 is set. If necessary, V4 and V5 are fixed to the values determined by the above-mentioned method, the value that makes the possibility of success in writing while changing V2 is obtained, and the obtained value is recorded in the recording region 102.

When performing the writing from the P state to AP state, first V1 is set to 0 and the V2, V4, and V5 values used when the writing from the AP state to the P state is already performed are used, thereby obtaining V3 so that the success probability of the writing is, for example, maximum while changing the voltage V3 of the source line 35 and recording the information for each sub-array 101 in the recording region 102.

As described above, for example, since these values are recorded in the recording region (recording unit) 102 outside the memory array at the time of performing an initial check and in the writing operation after the initial check is performed, the offset magnetic field having an appropriate magnitude can be applied to the element by referring to V1, V2, and V3 and the resistance R1 and R2 that are recorded in the recording region, the memory array, which can perform the writing operation with high reliability, can be realized.

The memory array where the fluctuation of the resistance of the magneto-resistive effect element for each sub-cell, the resistances of the variable resistance elements 5 and 10 (the variable resistance elements 36 and 37 of FIG. 3), the ON resistance of the switching element 4 (the CMOS transistor 33 of FIG. 3), the threshold current value of the spin torque magnetization reversal, and the value of the Hoff is corrected can be configured by the above-mentioned procedures.

Fourth Embodiment

Figure 4A:
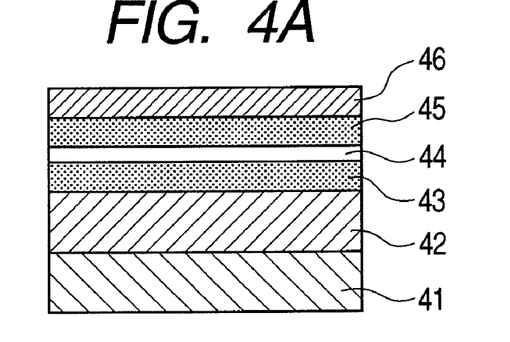
FIGS. 4A to 4C are configuration diagrams of one example of a magneto-resistive effect element of the present invention.
Figure 4B:
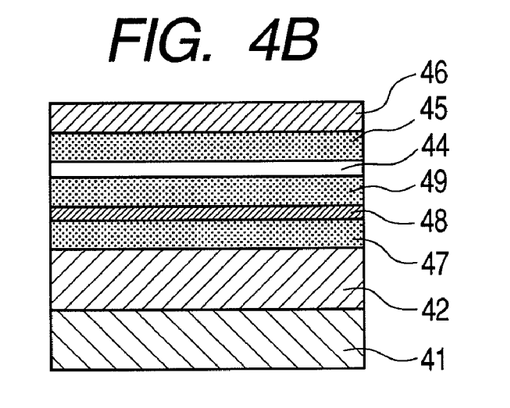
Figure 4C:
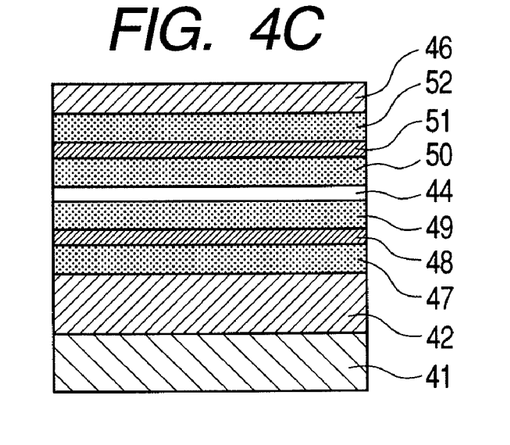

Each of FIGS. 4A to 4C shows an example of a stack structure of the magneto-resistive effect element as the stacked film of the present invention. The magneto-resistive effect element shown in FIG. 4A is a tunnel magneto-resistive effect film that has a basic configuration including an under layer 41, an anti-ferromagnetic layer 42, a fixed layer 43 whose magnetization direction is fixed in one direction by the exchange coupling field from the anti-ferromagnetic layer 42, an insulating barrier layer 44, a free layer 45 whose magnetization direction is rewritten by the spin torque magnetization reversal, and a cap layer 46. In the case of the film configuration, when the magnetization directions of the fixed layer 43 and the free layer 45 are opposite to each other (anti-parallel state), it is easy to stabilize the film configuration. As a result, it is easy to generate the Hoff as shown in FIG. 7A and the present invention is very effective to improve the yield of the memory.

The magneto-resistive effect film shown in FIG. 4B is an example including two layers 47 and 49 that are coupled to each other by an anti-ferromagnetic coupling while the fixed layer is away from an intermediate layer 48. In this case, since the magnetization directions of the two ferromagnetic layers 47 and 49 are opposite to each other, the static magnetic field coupling of the ferromagnetic layer 49 and the free layer 45 is weak such that the value of the Hoff as shown in FIG. 7A is small. However, since a large and small Hoff is generated, the present invention is effective in improving the yield of the memory.

The magneto-resistive effect film shown in FIG. 4C is an example that includes two layers 50 and 52 coupled to each other by an anti-ferromagnetic coupling while the free layer of FIG. 4B and the intermediate layer 51 are interposed between the two layers. In this case, the static magnetic field coupling between the two ferromagnetic layers 49 and 50 is very weak, such that the spin torque magnetization reversal can be made without applying the magnetic field as shown in FIG. 7B.

Figure 5:
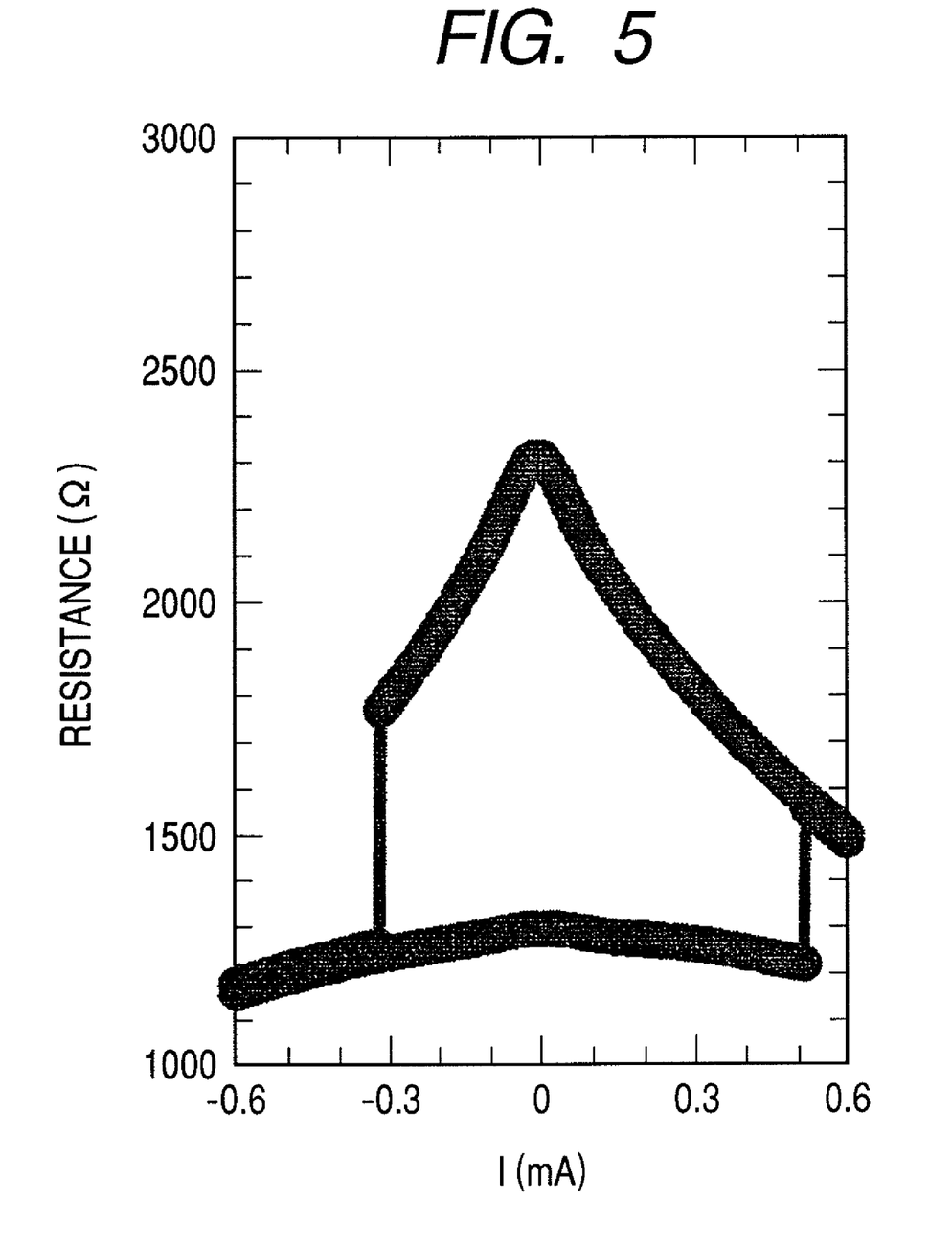
FIG. 5 is a diagram showing a current-resistance characteristic of the tunnel magneto-resistive effect element shown in FIG. 4C.

FIG. 5 is an example of a current-resistance hysteresis in the memory cell using the tunnel magneto-resistive effect film that uses the free layer having the structure of FIG. 4C.

Figure 6:
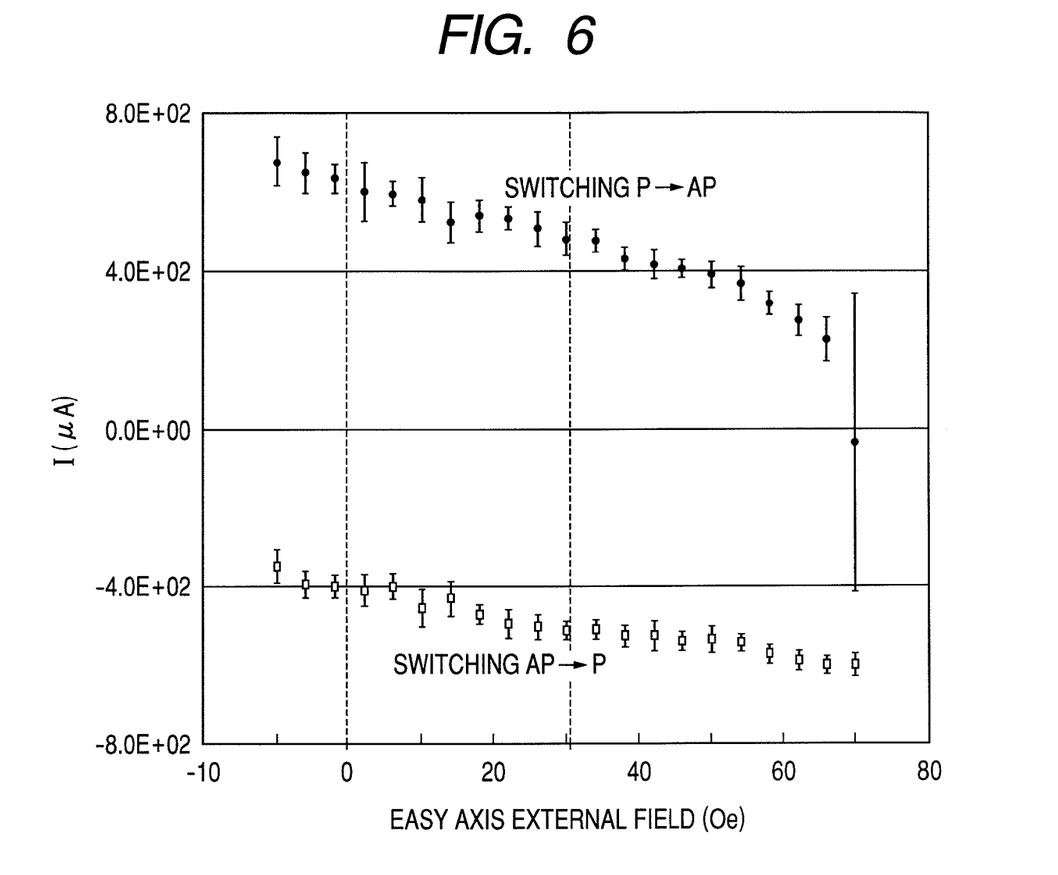
FIG. 6 is a diagram showing a relationship of easy axis direction magnetic field-threshold current value of the tunnel magneto-resistive effect element shown in FIG. 4C.

FIG. 6 is a diagram showing a relationship of easy axis direction magnetic field-threshold current value of the tunnel magneto-resistive effect element shown in FIG. 4C.

It can be appreciated that the spin torque magnetization reversal can be realized in the magnetic field of zero.

What is claimed is:

1. A spin memory comprising:
   a bit line and a word line;
   a magneto-resistive effect element that is disposed between the bit line and the word line;
   a first variable resistance element that is connected to one end of the bit line;
   a second variable resistance element that is connected to the other end of the bit line;
   a third variable resistance element that is disposed between the magneto-resistive effect element and the word line;
   a first voltage applying unit that applies voltage to the first variable resistance element;
   a second voltage applying unit that applies voltage to the second variable resistance element; and
   a third voltage applying unit that applies voltage to the third variable resistance element,
   wherein the magneto-resistive effect element including a first ferromagnetic layer whose magnetization direction is variable, a second ferromagnetic layer whose magnetization direction is fixed, and an intermediate layer that is disposed between the first ferromagnetic layer and the second ferromagnetic layer, and
   wherein when a writing operation is performed, based on a predetermined resistance value, the magnetization of the first ferromagnetic layer is reversed by a spin torque that is generated by flowing current between the first voltage applying unit and the second voltage applying unit and between the bit line and the third voltage applying unit.

2. The spin memory according to claim 1,
   wherein the resistance of the first variable resistance element is changed by the first voltage applying unit,
   wherein the resistance of the second variable resistance element is changed by the second voltage applying unit, and
   wherein the resistance of the third variable resistance element is changed by the third voltage applying unit.

3. The spin memory according to claim 2, wherein a current value flowing between the first voltage applying unit and the second voltage applying unit is variable.

4. The spin memory according to claim 1, wherein a current-induced magnetic field direction generated by flowing current between the first voltage applying unit and the second voltage applying unit is approximately parallel with a magnetization direction where the second ferromagnetic layer is fixed.

5. The spin memory according to claim 1, wherein a current-induced magnetic field direction generated by flowing current between the first voltage applying unit and the second voltage applying unit is approximately parallel with a magnetization easy axis of the first ferromagnetic layer.

6. The spin memory according to claim 1,
   wherein when the writing operation is performed, by reversing the spin torque magnetization,
   in the case where the magnetization direction of the first ferromagnetic layer is parallel with the magnetization direction of the second ferromagnetic layer, current flows from the first ferromagnetic layer to the second ferromagnetic layer, and
   in the case where the magnetization direction of the first ferromagnetic layer is anti-parallel with the magnetization direction of the second ferromagnetic layer, current flows from the second ferromagnetic layer to the first ferromagnetic layer.

7. The spin memory according to claim 1,
   wherein the magneto-resistive effect element has the first ferromagnetic layer arranged on the bit line side and the second ferromagnetic layer arranged on the word line side,
   when the writing operation is performed, if voltage applied to the first voltage applying unit is V1, voltage applied to the second voltage applying unit is V2, and voltage applied to the third voltage applying unit is V3,
   in the case where the magnetization direction of the first ferromagnetic layer is parallel with the magnetization direction of the second ferromagnetic layer, V2>V1 and V2>V3, and in the case where the magnetization direction of the first ferromagnetic layer is anti-parallel with the magnetization direction of the second ferromagnetic layer, V2>V1 and V2>V3>V1.

8. The spin memory according to claim 1,
   wherein the magneto-resistive effect element has the first ferromagnetic layer arranged on the word line side and the second ferromagnetic layer arranged on the bit line side,
   when the writing operation is performed, if voltage applied to the first voltage applying unit is V1, voltage applied to the second voltage applying unit is V2, and voltage applied to the third voltage applying unit is V3,
   in the case where the magnetization direction of the first ferromagnetic layer is parallel with the magnetization direction of the second ferromagnetic layer, V2>V1 and V2>V3>V1, and in the case where the magnetization direction of the first ferromagnetic layer is anti-parallel with the magnetization direction of the second ferromagnetic layer, V2>V1 and V2>V3.

9. The spin memory according to claim 7, further comprising a recording unit in which the V1 and V2 are previously recorded,
wherein when the writing operation is performed, the V1 and V2 are selected by referring to the recording unit.

10. The spin memory according to claim 8, further comprising a recording unit in which the V1 and V2 are previously recorded,
wherein when the writing operation is performed, the V1 and V2 are selected by referring to the recording unit.

11. The spin memory according to claim 1, wherein the variable resistance element is a CMOS.

12. The spin memory according to claim 1, wherein the voltage applying unit is an electrode.

13. The spin memory according to claim 1, wherein the first ferromagnetic layer is configured of ferromagnetic layers that are coupled to each other in an anti-parallel magnetization state via the intermediate layer.

14. A method for correcting an offset magnetic field in a spin memory that writes information using spin torque magnetization reversal,
wherein the spin memory includes a bit line and a word line, a magneto-resistive effect element that is disposed between the bit line and the word line, a first variable resistance element that is connected to one end of the bit line, a second variable resistance element that is connected to the other end of the bit line, a third variable resistance element that is disposed between the magneto-resistive effect element and the word line, a first voltage applying unit that applies voltage to the first variable resistance element, a second voltage applying unit that applies voltage to the second variable resistance element, and a third voltage applying unit that applies voltage to the third variable resistance element,
wherein the magneto-resistive effect element including a first ferromagnetic layer whose magnetization direction is variable, a second ferromagnetic layer whose magnetization direction is fixed, and an intermediate layer that is disposed between the first ferromagnetic layer and the second ferromagnetic layer, the method comprising steps of:
at the time of performing a writing operation that reverses the magnetization of the first ferromagnetic layer by using a spin torque generated by flowing current between the bit line and the third voltage applying unit, flowing current between the first voltage applying unit and the second voltage applying unit based on a predetermined resistance value; and
applying a magnetic field generated by current flowing between the first voltage applying unit and the second voltage applying unit to the first ferromagnetic layer.

15. The method according to claim 14,
wherein the resistance of the first variable resistance element is changed by the first voltage applying unit,
wherein the resistance of the second variable resistance element is changed by the second voltage applying unit, and
wherein the resistance of the third variable resistance element is changed by the third voltage applying unit.

* * * * *